United States Patent
Shih et al.

(10) Patent No.: US 8,670,572 B2
(45) Date of Patent: Mar. 11, 2014

(54) ANALOG-TO-DIGITAL CONVERTER AND ANALOG-TO-DIGITAL CONVERSION METHOD

(75) Inventors: Min-Yung Shih, Hsinchu (TW); Jui-Te Chiu, Hsinchu (TW); Yann-Ming Way, Sunnyvale, CA (US); Ching-Tzung Lin, Nantou (TW); Kuo-Hsuan Chang, Taipei (JP)

(73) Assignee: Fortemedia, Inc., Sunnyvale, CA (US)

( * ) Notice: Subject to any disclaimer, the term of this patent is extended or adjusted under 35 U.S.C. 154(b) by 693 days.

(21) Appl. No.: 12/950,021

(22) Filed: Nov. 19, 2010

(65) Prior Publication Data
US 2012/0128180 A1 May 24, 2012

(51) Int. Cl.
*A61F 11/06* (2006.01)
*G06F 17/00* (2006.01)

(52) U.S. Cl.
USPC ......................................... 381/71.13; 700/94

(58) Field of Classification Search
CPC ...... H04R 3/00; H04R 2410/00; G10L 19/04; G10L 19/18; H03M 3/43
USPC ........... 381/71.13; 700/94; 455/552.1, 73, 91; 375/295
See application file for complete search history.

(56) References Cited

U.S. PATENT DOCUMENTS

| 5,796,842 A * | 8/1998 | Hanna ............................... 381/4 |
| 7,398,102 B2 * | 7/2008 | Hidehiro et al. ........... 455/552.1 |
| 2004/0132488 A1 * | 7/2004 | Hidehiro et al. ........... 455/552.1 |
| 2009/0319279 A1 * | 12/2009 | Kong et al. .................... 704/500 |

* cited by examiner

*Primary Examiner* — Fan Tsang
*Assistant Examiner* — Eugene Zhao
(74) *Attorney, Agent, or Firm* — McClure, Qualey & Rodack, LLP

(57) ABSTRACT

The invention provides an analog-to-digital converter. In one embodiment, the analog-to-digital converter receives a first audio signal from a microphone, and comprises a coding selection module, a pre-amplifier, a 1-bit ΔΣ modulator, and a signal coding module. The coding selection module receives a mode signal and a channel selection signal, and generates a control signal according to the mode signal and the channel selection signal. The pre-amplifier amplifies the first audio signal to obtain a second audio signal. The 1-bit ΔΣ modulator converts the second audio signal from analog to digital to obtain a third audio signal. The signal coding module encodes a fourth audio signal according to the third audio signal as an output signal of the analog-to-digital converter when the control signal indicates that the mode signal selects an encoding mode, and forwards the third audio signal as the output signal of the analog-to-digital converter when the control signal indicates that mode signal does not select the encoding mode.

14 Claims, 10 Drawing Sheets

ANALOG-TO-DIGITAL CONVERTER AND ANALOG-TO-DIGITAL CONVERSION METHOD

BACKGROUND OF THE INVENTION

1. Field of the Invention

The invention relates to analog-to-digital converters, and more particularly to signal processing of analog-to-digital converters.

2. Description of the Related Art

Referring to FIG. 1, a block diagram of a sound processing device 150 comprising a microphone array is shown. In one embodiment, the sound processing device 150 comprises a plurality of microphone sensors 151~15n, a plurality of analog-to-digital converters (ADC) 161~16n, and a digital signal processor 170. The microphone sensors 151~15n detect sound pressure at different locations to generate a plurality of analog audio signals Ka~Kn. The analog-to-digital converters 161~16n respectively convert the analog audio signals Ka~Kn from analog-to-digital to obtain a plurality of digital audio signals Da~Dn. The digital signal processor 170 then receives the digital audio signals Da~Dn and processes the digital audio signals Da~Dn to generate an output audio signal I.

To convert the analog audio signals Ka~Kn to digital audio signals Da~Dn, the sound processing device 150 requires the analog-to-digital converters 161~16n as the circuit components thereof. The analog-to-digital converters 161~16n with an efficient function design can lower the processing load of the digital signal processor 170. In addition, the analog-to-digital converters 161~16n with a good output design can simply the circuit integration between the output terminals of the analog-to-digital converters 161~16n and the input terminals of the digital signal processor 170. Thus, an analog-to-digital converter with an efficient design is required.

BRIEF SUMMARY OF THE INVENTION

The invention provides an analog-to-digital converter. In one embodiment, the analog-to-digital converter receives a first audio signal from a microphone, and comprises a coding selection module, a pre-amplifier, a 1-bit $\Delta\Sigma$ modulator, and a signal coding module. The coding selection module receives a mode signal and a channel selection signal, and generates a control signal according to the mode signal and the channel selection signal. The pre-amplifier amplifies the first audio signal to obtain a second audio signal. The 1-bit $\Delta\Sigma$ modulator converts the second audio signal from analog to digital to obtain a third audio signal. The signal coding module encodes a fourth audio signal according to the third audio signal as an output signal of the analog-to-digital converter when the control signal indicates that the mode signal selects an encoding mode, and forwards the third audio signal as the output signal of the analog-to-digital converter when the control signal indicates that the mode signal does not select the encoding mode.

The invention provides an analog-to-digital converter. In one embodiment, the analog-to-digital converter receives a first audio signal from a microphone, and comprises a coding selection module, a pre-amplifier, a signal coding module, and a 1-bit $\Delta\Sigma$ modulator. The coding selection module receives a mode signal and a channel selection signal, and generates a control signal according to the mode signal and the channel selection signal. The pre-amplifier amplifies the first audio signal to obtain a second audio signal. The signal coding module encodes a third audio signal according to the second audio signal when the control signal indicates that the mode signal selects an encoding mode, and forwards the second audio signal as the third audio signal when the control signal indicate that the mode signal does not select the encoding mode. The 1-bit $\Delta\Sigma$ modulator converts the third audio signal from analog to digital to obtain the output signal of the analog-to-digital converter.

The invention provides an analog-to-digital converter. In one embodiment, the analog-to-digital converter receives a first audio signal from a microphone, and comprises a coding selection module, a pre-amplifier, a signal coding module, and a 1-bit $\Delta\Sigma$ modulator. The coding selection module receives a mode signal and a channel selection signal, generating a control signal according to the mode signal and the channel selection signal. The pre-amplifier amplifies the first audio signal to obtain a second audio signal. The signal coding module directs the pre-amplifier to amplify the first audio signal according to a normal gain to obtain the second audio signal when the control signal indicates that the mode signal does not select the encoding mode, and directs the pre-amplifier to amplify the first audio signal according to an adjusted gain to obtain the second audio signal when the control signal indicates that the mode signal selects the encoding mode. The 1-bit $\Delta\Sigma$ modulator converts the second audio signal from analog to digital to obtain an output signal of the analog-to-digital converter.

The invention provides an analog-to-digital conversion method. In one embodiment, an analog-to-digital converter comprises a pre-amplifier, a 1-bit $\Delta\Sigma$ modulator, and a signal coding module. First, a first audio signal is received from a microphone. A mode signal and a channel selection signal are also received. The first audio signal is amplified with the pre-amplifier to obtain a second audio signal. The second audio signal is then converted from analog to digital with the 1-bit $\Delta\Sigma$ modulator to obtain a third audio signal. When the control signal indicates that the mode signal selects an encoding mode, a fourth audio signal is encoded with the signal coding module according to the third audio signal as an output signal of the analog-to-digital converter. When the control signal indicates that the mode signal does not select the encoding mode, the third audio signal is forwarded as the output signal of the analog-to-digital converter.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
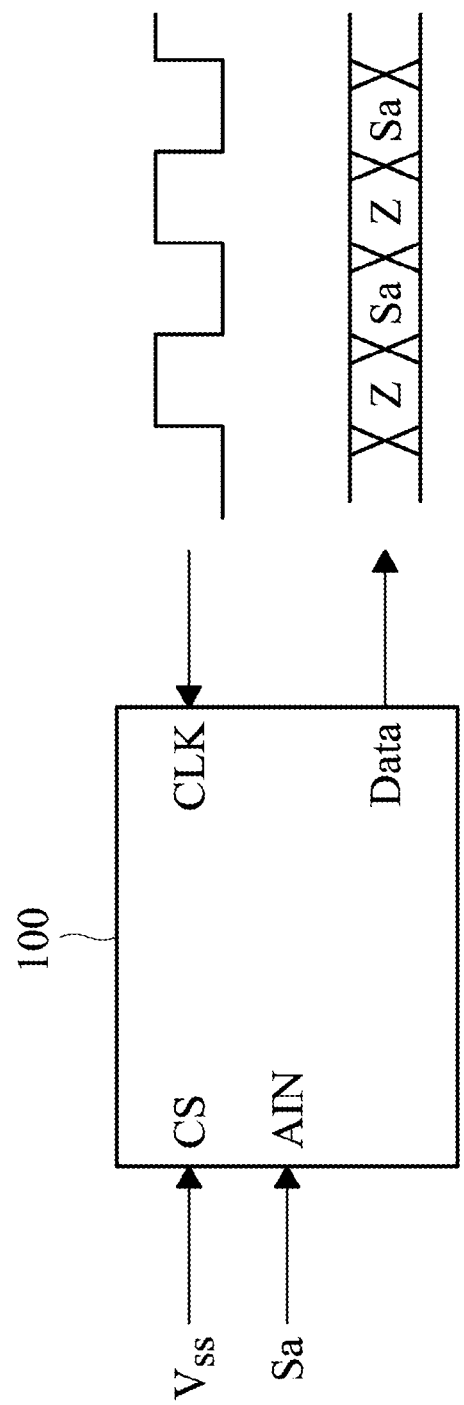
FIGS. 2A and 2B are schematic diagrams of input signals and output signals of an analog-to-digital converter.
Figure 2B:
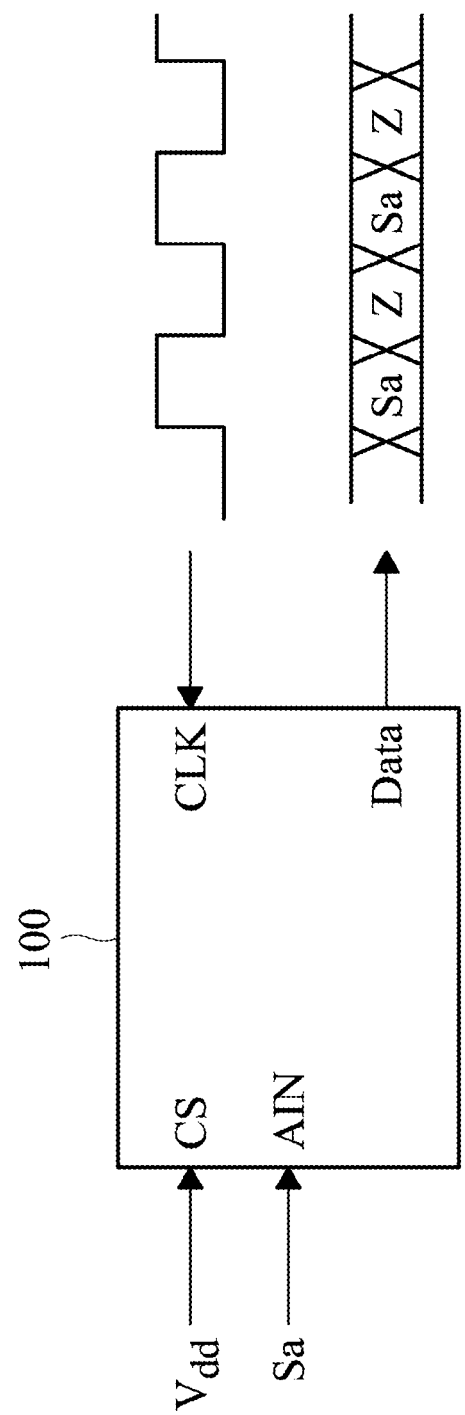

A microphone sensor detects air pressure of a sound wave to generate an analog audio signal. To convert the analog audio signal to a digital audio signal, an analog-to-digital converter is required. Referring to FIGS. 2A and 2B, schematic diagrams of input signals and output signals of an analog-to-digital converter 100 are shown. The analog-to-digital converter 100 has three input terminals CS, AIN, CLK and an output terminal The input terminal AIN receives an analog audio signal Sa from a microphone sensor. The input terminal CLK receives a clock signal CLK oscillating between a logic low level and a logic high level. The input terminal CS is coupled to a ground voltage Vss or a voltage source Vdd.

The analog-to-digital converter 100 converts the analog input signal Sa from analog to digital to obtain a digital audio signal. The analog-to-digital converter 100 then determines an output format of the digital audio signal according to the voltage of the input terminal CS. If the input terminal CS is coupled to the ground voltage Vss, the analog-to-digital converter 100 outputs data bits of the digital audio signal when the clock signal CLK is at a logic low level, as shown in FIG. 2A. When the clock signal CLK is at a logic high level, the output terminal of the analog-to-digital converter 100 is switched to a high-impedance state Z, and the analog-to-digital converter 100 does not output data of the digital audio signal. If the input terminal CS is coupled to the voltage source Vdd, the analog-to-digital converter 100 outputs data bits of the digital audio signal when the clock signal CLK is at a logic high level, as shown in FIG. 2B. When the clock signal CLK is at a logic low level, the output terminal of the analog-to-digital converter 100 is switched to the high-impedance state Z, and the analog-to-digital converter 100 does not output data of the digital audio signal.

Figure 1:
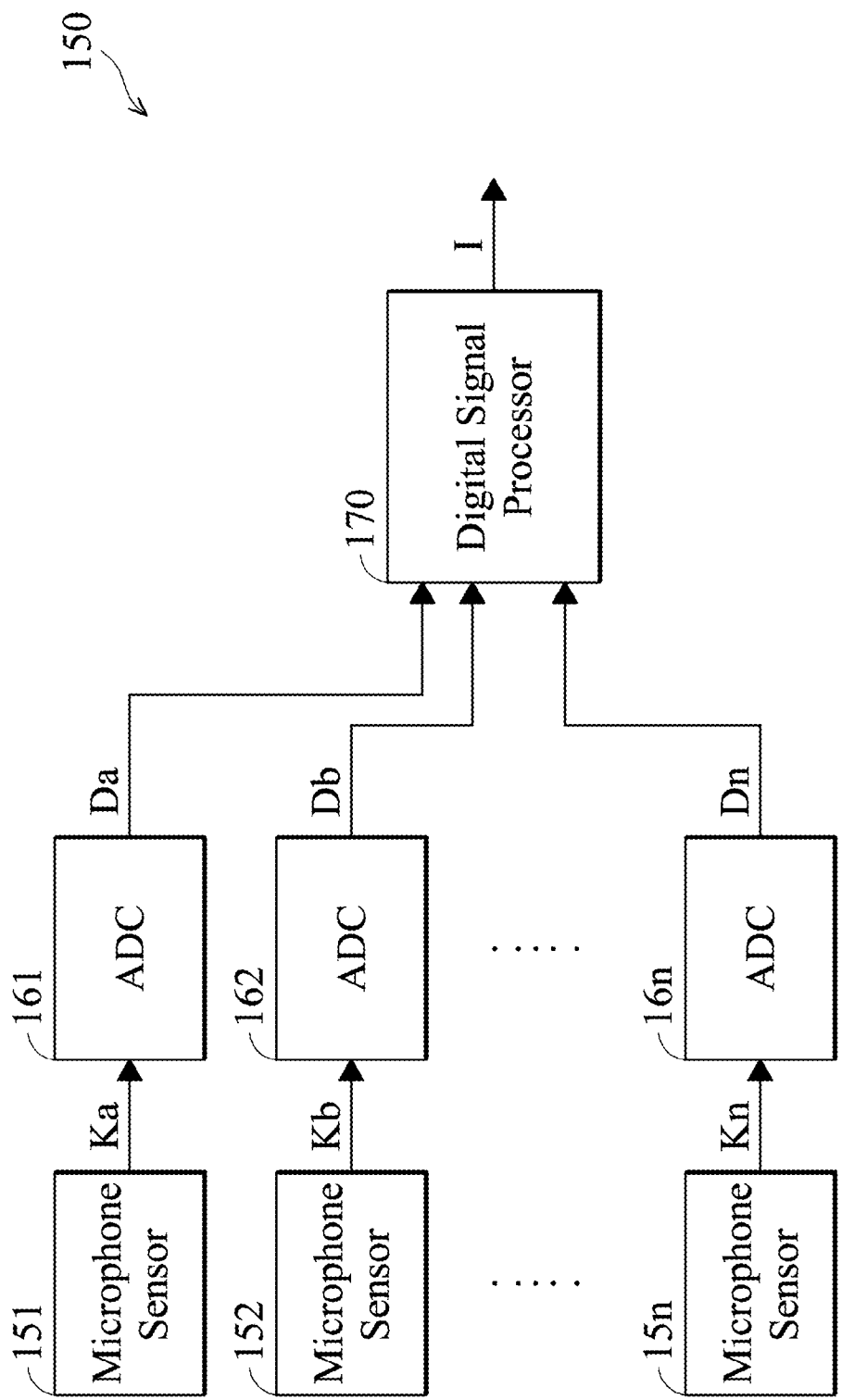
FIG. 1 is a block diagram of a sound processing device comprising a microphone array.

The analog-to-digital converter 100 shown in FIGS. 1 and 2 can only convert an analog audio signal to a digital audio signal. The analog-to-digital converter 100 shown in FIGS. 2A and 2B, however, does not have a function for encoding the output signal of the analog-to-digital converter. A new analog-to-digital converter is therefore provided.

Figure 3:
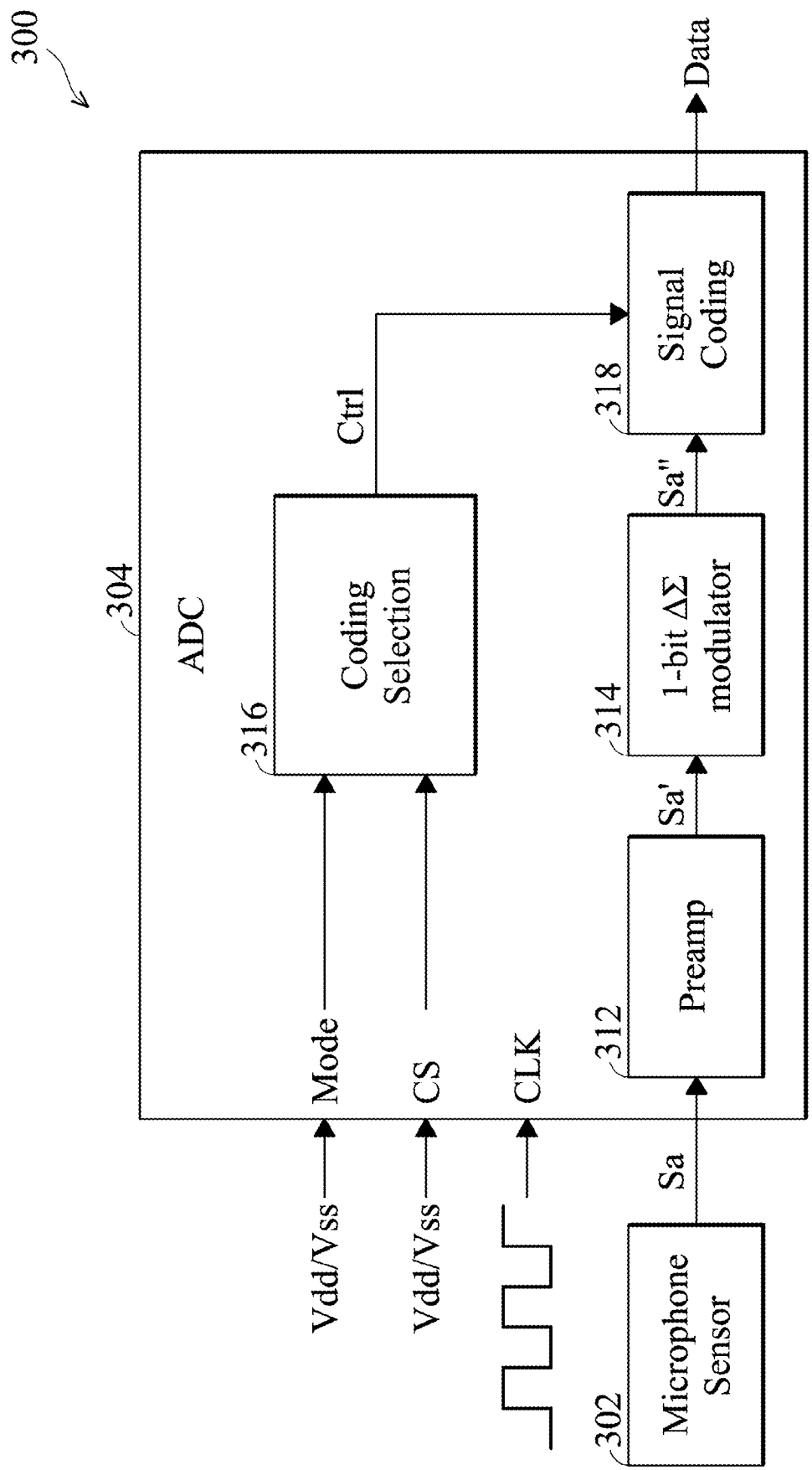
FIG. 3 is a block diagram of an analog-to-digital converter according to the invention.

Referring to FIG. 3, a block diagram of an analog-to-digital converter 304 according to the invention is shown. The analog-to-digital converter (ADC) 304 has four input terminals and an output terminal. Input terminals Mode and CS can be coupled to a voltage source Vdd or a ground voltage Vss. A mode signal and a channel selection signal CS are then respectively obtained via the input terminals Mode and CS. When the input terminal Mode is coupled to the voltage source Vdd, the mode signal is at a logic high level to indicate that an encoding mode is selected. When the input terminal Mode is coupled to the ground voltage Vss, the mode signal is at a logic low level to indicate that the encoding mode is not selected. An input terminal CLK receives a clock signal which periodically oscillates between a logic high level and a logic low level. A microphone sensor 302 detects a sound pressure to generate an analog audio signal Sa. The analog-to-digital converter 304 then receives the audio signal Sa from the microphone sensor 302 and processes the analog audio signal Sa according to the mode signal to generate a digital audio signal. The analog-to-digital converter 304 then outputs data of the digital audio signal according to the channel selection signal CS and the clock signal via an output terminal.

In one embodiment, the analog-to-digital converter 304 comprises a pre-amplifier 312, a 1-bit $\Delta\Sigma$ modulator 314, a signal coding module 318, and a coding selection module 316. The pre-amplifier 312 amplifies the analog audio signal Sa to obtain an amplified audio signal Sa'. The 1-bit $\Delta\Sigma$ modulator 314 then converts the amplified audio signal Sa' from analog to digital to obtain a digital audio signal Sa". The coding selection module 316 receives the mode signal and the channel selection signal CS and then generates a control signal Ctrl according to the mode signal and the channel selection signal CS. The control signal Ctrl is then sent to the signal coding module 318. When the control signal Ctrl indicates that the encoding mode has been selected, the signal coding module 318 encodes a coded audio signal according to the digital audio signal Sa" as an output signal of the analog-to-digital converter 304. When the control signal Ctrl indicates that the encoding mode is not selected, the signal coding module 318 directly forwards the digital audio signal Sa" generated by the 1-bit $\Delta\Sigma$ modulator 314 as an output signal of the analog-to-digital converter 304.

The channel selection signal CS determines a format of the output signal of the analog-to-digital converter 304. When the input terminal CS is coupled to a ground voltage Vss, the channel selection signal CS is at a logic low level. The analog-to-digital converter 304 then outputs data bits of the output signal when the clock signal oscillates to a logic low level, and does not output data of the output signal when the clock signal oscillates to a logic high level. In other words, the output terminal of the analog-to-digital converter 304 is switched to a high-impedance state (Z shown in FIG. 4) when the clock signal oscillates to a logic high level. When the input terminal CS is coupled to a voltage source Vdd, the channel selection signal CS is at a logic high level. The analog-to-digital converter 304 then outputs data bits of the output signal when the clock signal oscillates to a logic high level, and does not output data of the output signal when the clock signal oscillates to a logic low level. In other words, the output terminal of the analog-to-digital converter 304 is switched to a high-impedance state (Z shown in FIG. 4) when the clock signal oscillates to a logic low level.

Figure 4:
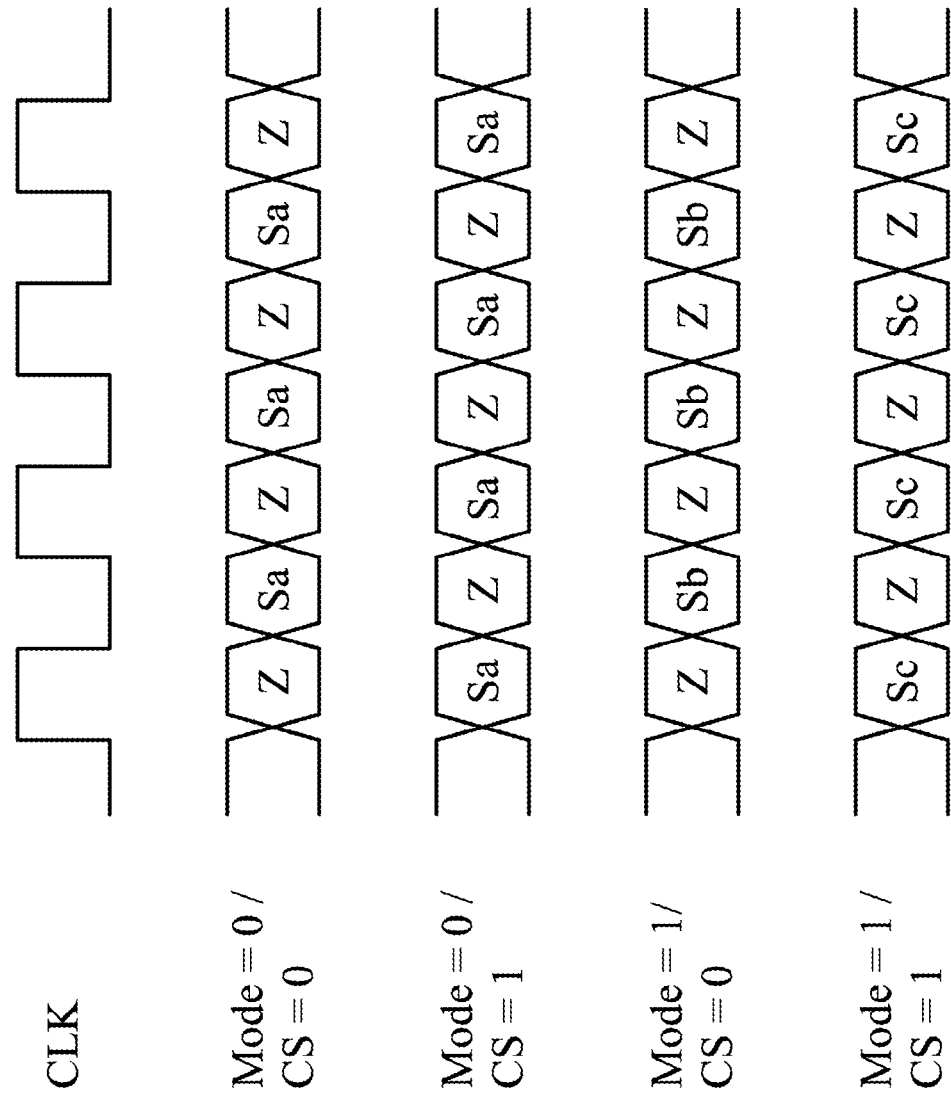
FIG. 4 is a data diagram of an output signal of an analog-to-digital converter according to the invention.

Referring to FIG. 4, a data diagram of an output signal of the analog-to-digital converter 304 according to the invention is shown. When the mode signal is at a logic low level, an encoding mode is not selected, and the digital audio signal Sa" generated by the 1-bit $\Delta\Sigma$ modulator 314 is directly taken as an output signal of the analog-to-digital converter 304 without encoding. If the channel selection signal CS is at a logic low level, the analog-to-digital converter 304 outputs data bits of the digital audio signal Sa" when the clock signal is at the logic low level. If the channel selection signal CS is at a logic high level, the analog-to-digital converter 304 outputs data bits of the digital audio signal Sa" when the clock signal is at the logic high level. When the mode signal is at a logic high level, the encoding mode is selected, and the signal coding module 318 encodes a coded audio signal Sb or Sc as an output signal of the analog-to-digital converter 304. If the channel selection signal CS is at a logic low level, the analog-to-digital converter 304 outputs data bits of the coded audio signal Sb when the clock signal is at the logic low level. If the channel selection signal CS is at a logic high level, the analog-to-digital converter 304 outputs data bits of the coded audio signal Sc when the clock signal is at the logic high level. The signal coding module 318 performs different encoding processes to encode different coded audio signals Sb and Sc when the channel selection signal CS is at different levels.

The signal coding module 318 performs an encoding process in a variety of ways comprising offset adjustment, gain adjustment, phase adjustment, and delay adjustment. In one embodiment, the signal coding module 318 adds a positive offset value to the digital audio signal Sa" to obtain the coded audio signal if the channel selection signal CS is at a logic low level, and the signal coding module 318 adds a negative offset value to the digital audio signal Sa" to obtain the coded audio signal if the channel selection signal CS is at a logic high level. In another embodiment, the signal coding module 318 multiplies the digital audio signal Sa" by a first multiplier to obtain the coded audio signal if the channel selection signal CS is at a logic low level, and the signal coding module 318 multiplies the digital audio signal Sa" by a second multiplier to obtain the coded audio signal if the channel selection signal CS is at a logic high level, wherein the first multiplier is greater than 1 and the second multiplier is smaller than 1.

Figure 5B:
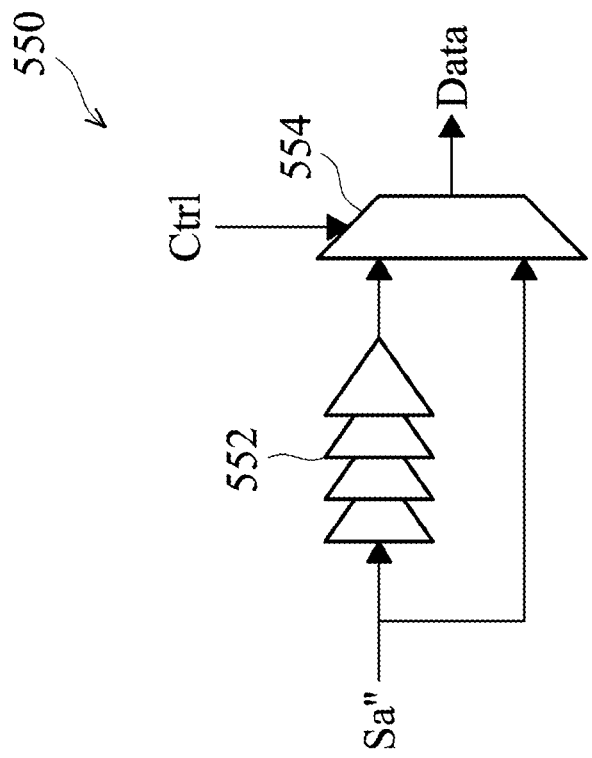
FIG. 5B is a block diagram of another embodiment of a signal coding module according to the invention.
Figure 5A:
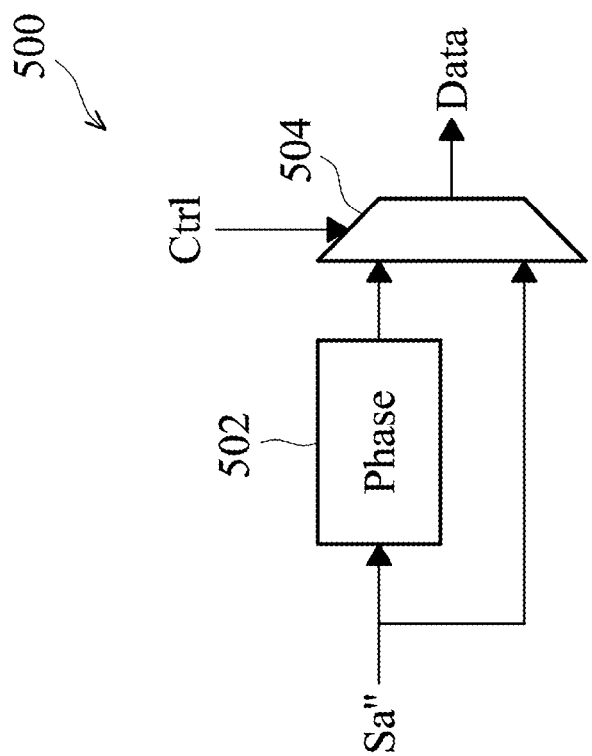
FIG. 5A is a block diagram of an embodiment of a signal coding module according to the invention.

In another embodiment, the signal coding module 318 does not alter the phase of the digital audio signal Sa" if the channel selection signal CS is at a logic low level, and the signal coding module 318 inverts the phase of the digital audio signal Sa" to obtain the coded audio signal if the channel selection signal CS is at a logic high level. Referring to FIG. 5A, a block diagram of an embodiment of a signal coding module 500 according to the invention is shown. In one embodiment, the signal coding module 500 comprises a phase inverter 502 and a multiplexer 504. The signal coding module 500 receives a digital audio signal Sa" from the 1-bit $\Delta\Sigma$ modulator 314. The phase inverter 502 then inverts the phase of the digital audio signal Sa" to obtain a coded audio signal. The multiplexer 504 then selects an output signal from the coded audio signal and the digital audio signal Sa" according to the control signal Ctrl generated by the coding selection module 316. If the control signal Ctrl indicates that the channel selection signal CS is at a logic low level, the multiplexer 504 selects the digital audio signal Sa" as the output signal. If the control signal Ctrl indicates that the channel selection signal CS is at a logic high level, the multiplexer 504 selects the coded audio signal generated by the phase inverter 502 as the output signal.

In another embodiment, the signal coding module 314 delays the digital audio signal Sa" to obtain the coded audio signal if the channel selection signal CS is at a logic low level, and the signal coding module 314 does not delay the digital audio signal Sa" if the channel selection signal CS is at a logic high level. Referring to FIG. 5B, a block diagram of an embodiment of a signal coding module 550 according to the invention is shown. In one embodiment, the signal coding module 550 comprises a delay module 552 and a multiplexer 554. The signal coding module 550 receives a digital audio signal Sa" from the 1-bit $\Delta\Sigma$ modulator 314. The delay module 552 delays the digital audio signal Sa" to obtain a coded audio signal. The multiplexer 554 then selects an output signal from the coded audio signal and the digital audio signal Sa" according to the control signal Ctrl generated by the coding selection module 316. If the control signal Ctrl indicates that the channel selection signal CS is at a logic high level, the multiplexer 504 selects the digital audio signal Sa" as the output signal. If the control signal Ctrl indicates that the channel selection signal CS is at a logic low level, the multiplexer 504 selects the coded audio signal generated by the delay module 552 as the output signal.

Figure 6:
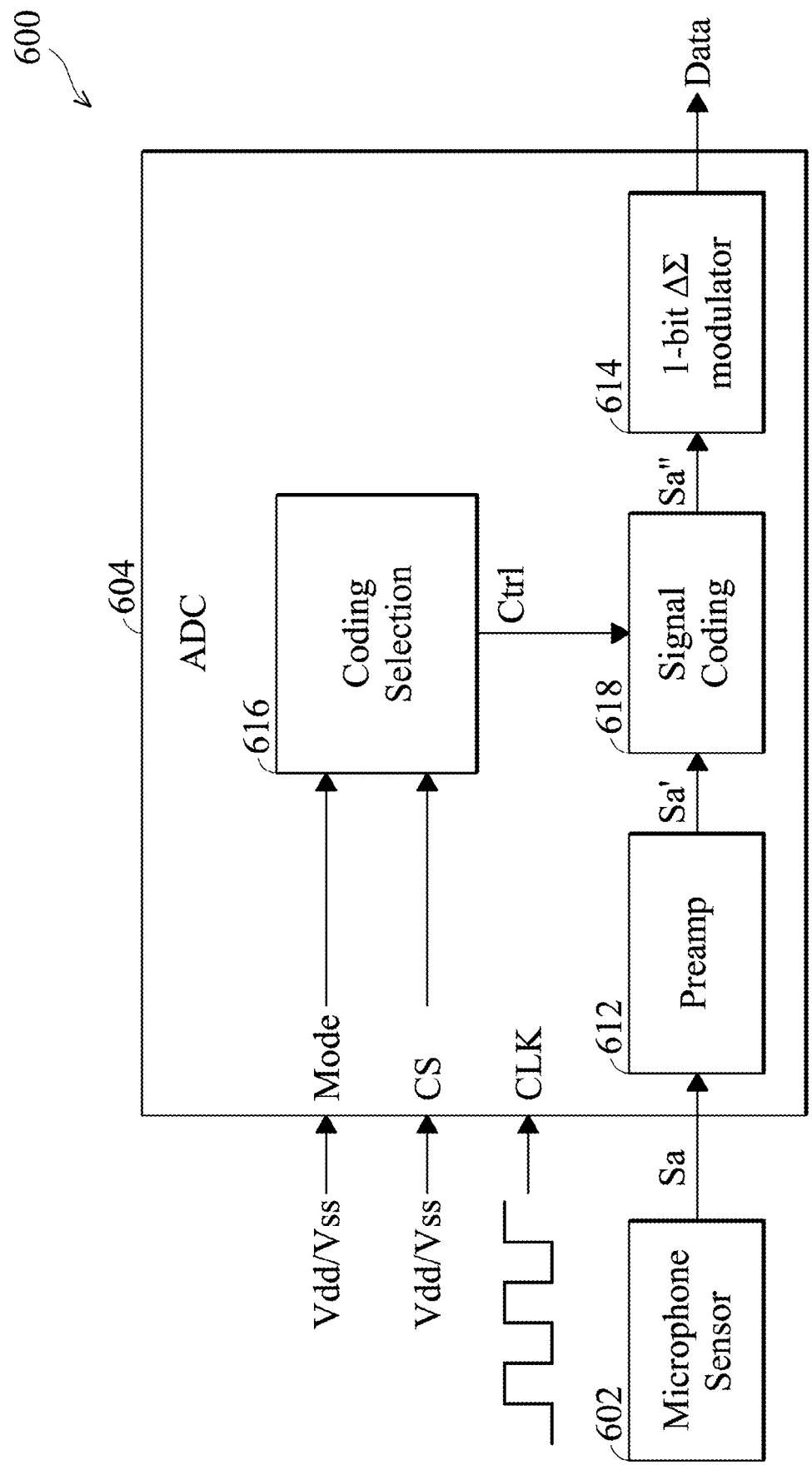
FIG. 6 is a block diagram of another embodiment of an analog-to-digital converter according to the invention.

The signal coding module 318 shown in FIG. 3 can be integrated with the pre-amplifier 312 or the 1-bit $\Delta\Sigma$ modulator 314. In one embodiment, the signal coding module 318 is integrated with the 1-bit $\Delta\Sigma$ modulator 314. Referring to FIG. 6, a block diagram of another embodiment of an analog-to-digital converter 604 according to the invention is shown. The analog-to-digital converter 604 comprises a pre-amplifier 612, a 1-bit $\Delta\Sigma$ modulator 614, a coding selection module 616, and a signal coding module 618. The functions of the pre-amplifier 612 and the coding selection module 616 are the same as those of the pre-amplifier 312 and the coding selection module 316 shown in FIG. 3. The control signal Ctrl generated by the coding selection module 616 is sent to the 1-bit $\Delta\Sigma$ modulator 614. The signal coding module 618 receives an amplified audio signal Sa' from the pre-amplifier 612. When the control signal Ctrl indicates that an encoding mode has been selected, the signal coding module 618 encodes a coded audio signal Sa" according to the amplified audio signal Sa'. When the control signal Ctrl indicates that the encoding mode has been selected, the signal coding module 618 directly forwards the amplified audio signal as the coded audio signal Sa". The 1-bit $\Delta\Sigma$ modulator 614 then converts the amplified audio signal Sa" from analog to digital to obtain a digital audio signal as an output signal of the analog-to-digital converter 604. The format of data of the digital audio signal output by the analog-to-digital converter 604 is similar to that shown in FIG. 4.

Figure 7:
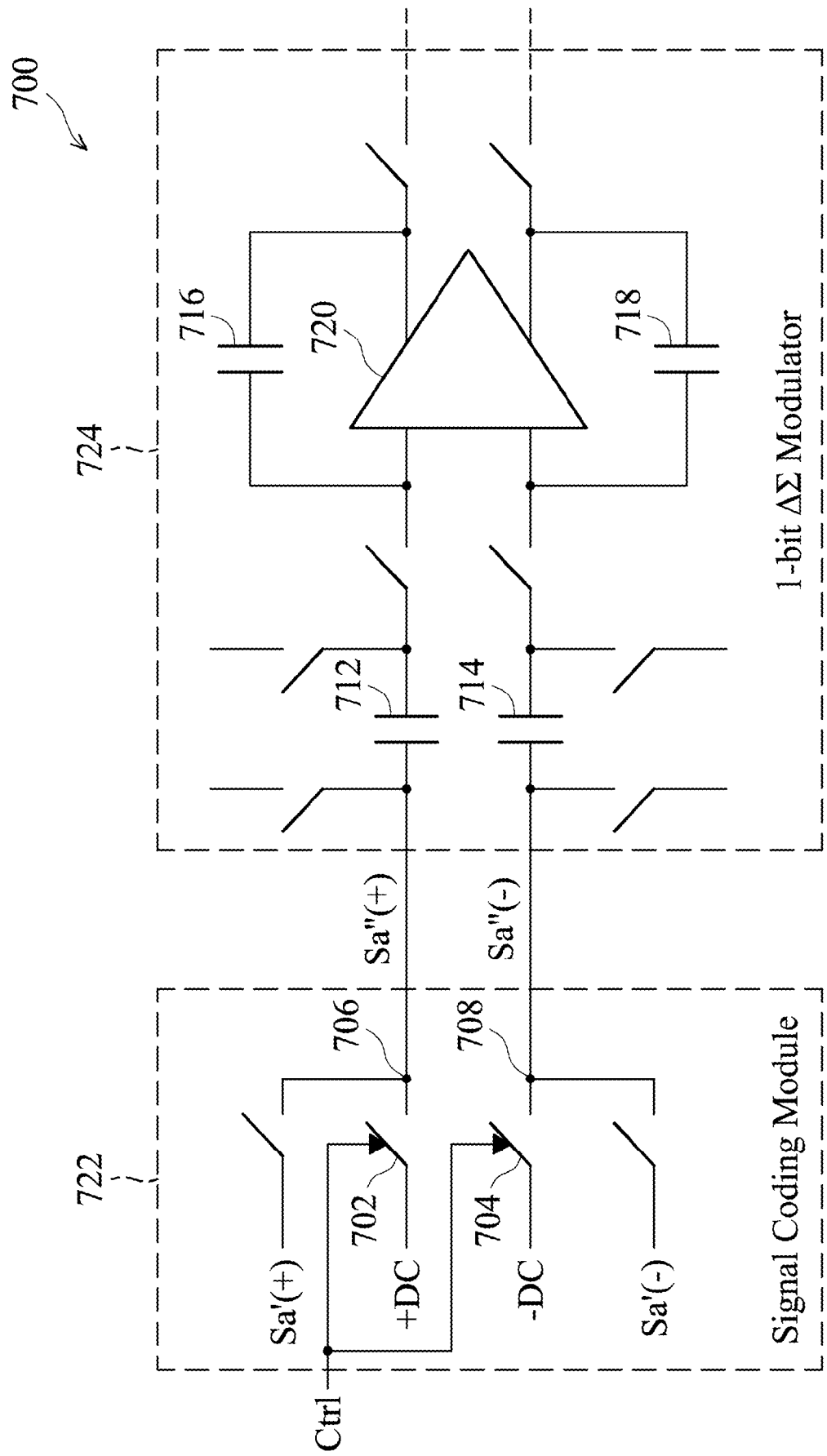
FIG. 7 is a block diagram of another embodiment of a 1-bit $\Delta\Sigma$ modulator and a signal coding module according to the invention.

In one embodiment, the encoding process of the signal coding module 618 is by DC offset adjustment. When the control signal Ctrl indicates that the encoding mode has been selected, the signal coding module 618 adds a positive DC offset to the amplified audio signal Sa' to obtain the coded audio signal Sa" if the channel selection signal CS is at a logic low level, and the signal coding module 618 adds a negative DC offset to the amplified audio signal Sa' to obtain the coded audio signal Sa" if the channel selection signal CS is at a logic high level. Referring to FIG. 7, a block diagram of an embodiment of a signal coding module 722 and a 1-bit $\Delta\Sigma$ modulator 724 according to the invention is shown. The signal coding module 722 comprises two switches 702 and 704 controlled by the control signal Ctrl. The 1-bit $\Delta\Sigma$ modulator 724 has two input terminals 706 and 708 and comprises an operational amplifier 720, four capacitors 712, 714, 716, and 718, and a plurality of switches. If the control signal Ctrl indicates that the channel selection signal CS is at a logic low level, the switch 702 couples a positive DC voltage to the input terminal 706, and the switch 704 couples a negative DC voltage to the input terminal 708, thereby adding a positive DC offset to the amplified audio signal Sa' to generate an encoded audio signal Sa" sent to the input terminals 706 and 708 of the 1-bit $\Delta\Sigma$ modulator 724. If the control signal indicates that the channel selection signal CS is at a logic high level, the switch 702 couples a negative DC voltage to the input terminal 706, and the switch 704 couples a positive DC voltage to the input terminal 708, thereby adding a negative DC offset to the amplified audio signal Sa' to generate an encoded audio signal Sa" sent to the input terminals 706 and 708 of the 1-bit $\Delta\Sigma$ modulator 724.

Figure 8:
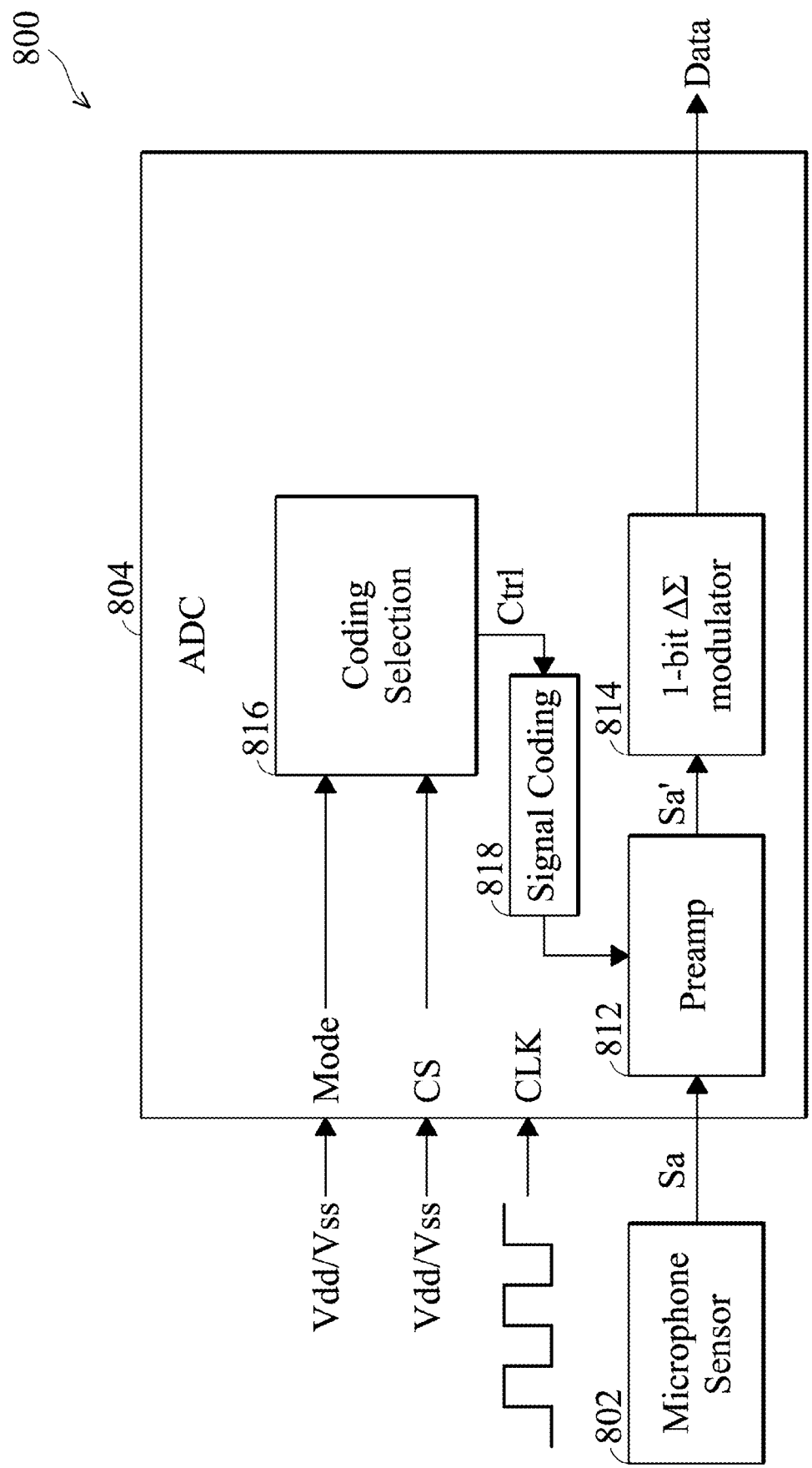
FIG. 8 is a block diagram of another embodiment of an analog-to-digital converter according to the invention.

In another embodiment, the signal coding module 318 is integrated with the pre-amplifier 312. Referring to FIG. 8, a block diagram of another embodiment of an analog-to-digital converter 804 according to the invention is shown. The analog-to-digital converter 804 comprises a pre-amplifier 812, a 1-bit $\Delta\Sigma$ modulator 814, a coding selection module 816, and a signal coding module 818. The functions of the 1-bit $\Delta\Sigma$ modulator 814 and the coding selection module 816 are the same as those of the 1-bit ΔΣ modulator 314 and the coding selection module 316 shown in FIG. 3. The control signal Ctrl generated by the coding selection module 816 is sent to the signal coding module 818. The pre-amplifier 812 receives an analog audio signal Sa from the microphone sensor 802. When the control signal Ctrl indicates that an encoding mode has not been selected, the signal coding module 818 directs the pre-amplifier 812 to amplify the analog audio signal Sa according to a normal gain to obtain an amplified audio signal Sa' sent to the 1-bit ΔΣ modulator 814. When the control signal Ctrl indicates that the encoding mode is selected, the signal coding module 818 directs the pre-amplifier 814 to amplify the audio signal Sa according to an adjusted gain to obtain the amplified audio signal Sa' sent to the 1-bit ΔΣ modulator 814. The format of data of the digital audio signal output by the analog-to-digital converter 604 is similar to that shown in FIG. 4.

Figure 9:
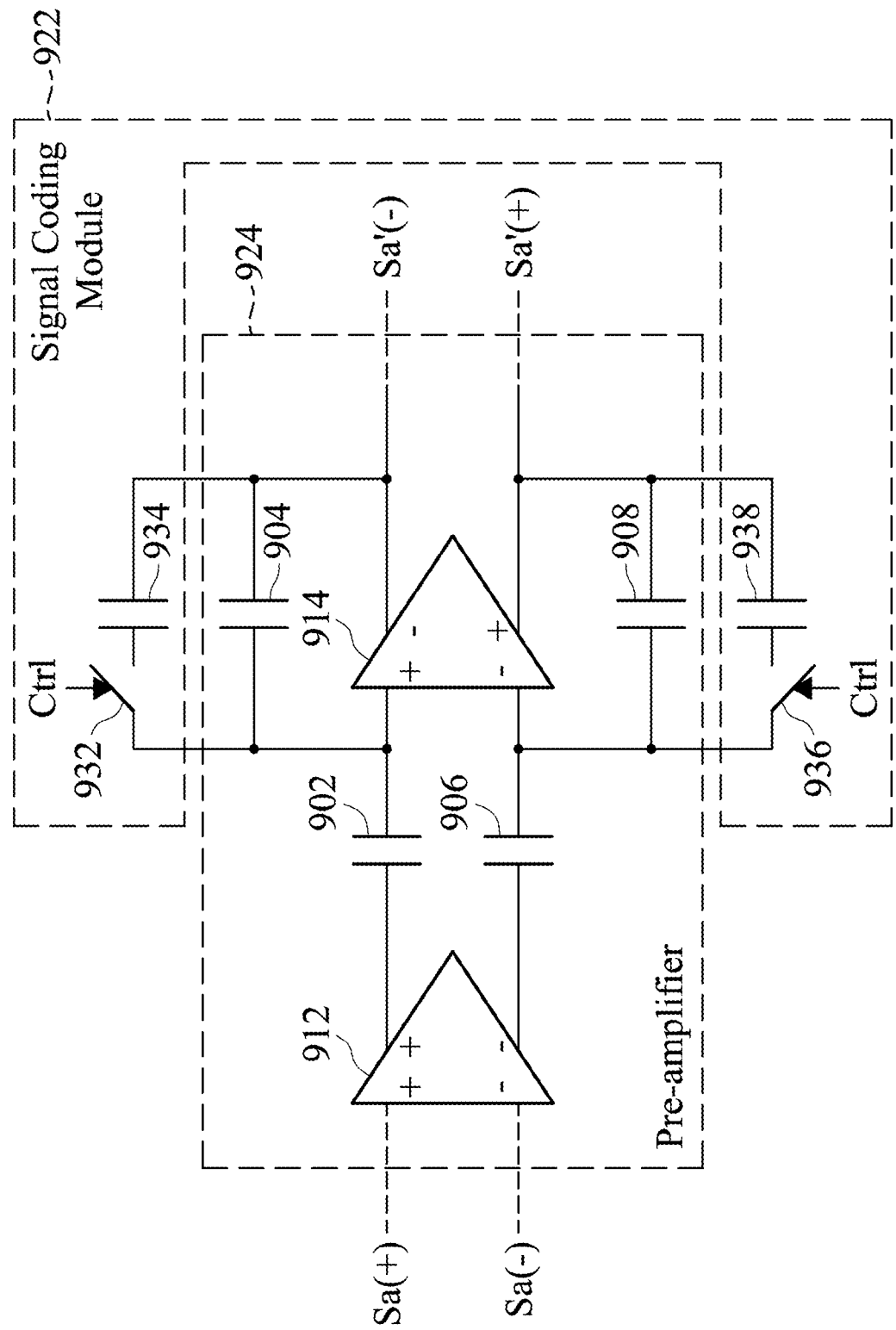
FIG. 9 is a block diagram of another embodiment of a pre-amplifier and a signal coding module according to the invention.

In one embodiment, the encoding process of the pre-amplifier 814 is by gain adjustment. When the control signal Ctrl indicates that the encoding mode has been selected, the pre-amplifier 814 amplifies the analog audio signal Sa according to a first adjusted gain to obtain the amplified audio signal Sa' if the channel selection signal CS is at the logic low level, and the pre-amplifier 814 amplifies the analog audio signal Sa according to a second adjusted gain to obtain the amplified audio signal Sa' if the channel selection signal is at the logic high level, wherein the first adjusted gain is greater than 1 and the second adjusted gain is less than 1. Referring to FIG. 9, a block diagram of an embodiment of a pre-amplifier 924 and a signal coding module 922 according to the invention is shown. The pre-amplifier 924 comprises two operational amplifiers 912 and 914, and four capacitors 902, 904, 906, and 908. Both of the operational amplifiers 912 and 914 have two input terminals and two output terminals. The two input terminals of the operational amplifier 912 receive the analog audio signal Sa. The two output terminals of the operational amplifier 914 outputs the amplified audio signal Sa'. The capacitor 902 is coupled between a positive output terminal of the operational amplifier 912 and a positive input terminal of the operational amplifier 914. The capacitor 906 is coupled between a negative output terminal of the operational amplifier 912 and a negative input terminal of the operational amplifier 914. The capacitor 904 is coupled between a positive input terminal and a negative output terminal of the operational amplifier 914. The capacitor 908 is coupled between a negative input terminal and a positive output terminal of the operational amplifier 914.

The signal coding module 922 comprises two switches 932 and 936 and two capacitors 934 and 938. The switch 932 and the capacitor 934 are connected in series between the positive input terminal and the negative output terminal of the operational amplifier 914. The switch 936 and the capacitor 938 are connected in series between the negative input terminal and the positive output terminal of the operational amplifier 914. When the control signal Ctrl indicates that the encoding mode is selected, the signal coding module 922 directs the switch 932 to couple the capacitor 934 between the positive input terminal and the negative output terminal of the operational amplifier 914, and directs the switch 936 to couple the capacitor 938 between the negative input terminal and the positive output terminal of the operational amplifier 914, thereby adjusting a ratio between capacitance of the capacitors 902 and 904 and a second ratio between capacitance of the capacitors 906 and 908 to be equal to the adjusted gain and adjusting the gain of the amplified audio signal Sa' to the adjusted gain. When the control signal Ctrl indicates that encoding mode is not selected, the signal coding module 922 opens the switches 932 and 936, thereby adjusting a ratio between capacitance of the capacitors 902 and 904 and a second ratio between capacitance of the capacitors 906 and 908 to be equal to the normal gain and adjusting the gain of the amplified audio signal Sa' to the normal gain.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter, receiving a first audio signal from a microphone, comprising:
    a coding selection module, receiving a mode signal and a channel selection signal, and generating a control signal according to the mode signal and the channel selection signal;
    a pre-amplifier, amplifying the first audio signal to obtain a second audio signal;
    a 1-bit ΔΣ modulator, converting the second audio signal from analog to digital to obtain a third audio signal; and
    a signal coding module, encoding a fourth audio signal according to the third audio signal as an output signal of the analog-to-digital converter when the control signal indicates that the mode signal selects an encoding mode, and forwarding the third audio signal as the output signal of the analog-to-digital converter when the control signal indicates that the mode signal does not select the encoding mode.

2. The analog-to-digital converter as claimed in claim 1, wherein the analog-to-digital converter receives a clock signal oscillating between a logic low level and a logic high level, and the analog-to-digital converter outputs data bits of the output signal when the clock signal is at the logic low level if the channel selection signal is at the logic low level, and the analog-to-digital converter outputs data bits of the output signal when the clock signal is at the logic high level if the channel selection signal is at the logic high level.

3. The analog-to-digital converter as claimed in claim 1, wherein when the control signal indicates the mode signal selects the encoding mode, the signal coding module adds a positive offset value to the third audio signal to obtain the fourth audio signal if the channel selection signal is at a logic low level, and the signal coding module adds a negative offset value to the third audio signal to obtain the fourth audio signal if the channel selection signal is at a logic low level.

4. The analog-to-digital converter as claimed in claim 1, wherein when the control signal indicates that the mode signal selects the encoding mode, the signal coding module multiplies the third audio signal by a first multiplier to obtain the fourth audio signal if the channel selection signal is at a logic low level, and the signal coding module multiplies the third audio signal by a second multiplier to obtain the fourth audio signal if the channel selection signal is at a logic low level, wherein the first multiplier is greater than 1 and the second multiplier is smaller than 1.

5. The analog-to-digital converter as claimed in claim 1, wherein when the control signal indicates that the mode signal selects the encoding mode, the signal coding module does not alter the phase of the third audio signal to obtain the fourth audio signal if the channel selection signal is at a logic low level, and the signal coding module inverts the phase of the third audio signal to obtain the fourth audio signal if the channel selection signal is at a logic low level.

6. The analog-to-digital converter as claimed in claim 5, wherein the signal coding module comprises:
   a phase inverter, inverting the phase of the third audio signal to obtain the fourth audio signal; and
   a multiplexer, selecting the fourth audio signal as the output signal when the control signal indicates that the channel selection signal is at the logic high level, and selecting the third audio signal as the output signal when the control signal indicates that the channel selection signal is at the logic low level.

7. The analog-to-digital converter as claimed in claim 1, wherein when the control signal indicates that the mode signal selects the encoding mode, the signal coding module delays the third audio signal to obtain the fourth audio signal if the channel selection signal is at a logic low level, and the signal coding module does not delay the third audio signal to obtain the fourth audio signal if the channel selection signal is at a logic low level.

8. The analog-to-digital converter as claimed in claim 7, wherein the signal coding module comprises:
   a delay module, delaying the third audio signal to obtain the fourth audio signal; and
   a multiplexer, selecting the fourth audio signal as the output signal when the control signal indicates that the channel selection signal is at the logic high level, and selecting the third audio signal as the output signal when the control signal indicates that the channel selection signal is at the logic low level.

9. An analog-to-digital conversion method, wherein an analog-to-digital converter comprises a pre-amplifier, a 1-bit ΔΣ modulator, and a signal coding module, and the analog-to-digital conversion method comprising:
   receiving a first audio signal from a microphone;
   receiving a mode signal and a channel selection signal;
   amplifying the first audio signal with the pre-amplifier to obtain a second audio signal;
   converting the second audio signal from analog to digital with the 1-bit ΔΣ modulator to obtain a third audio signal; and
   when the control signal indicates that the mode signal selects an encoding mode, encoding a fourth audio signal with the signal coding module according to the third audio signal as an output signal of the analog-to-digital converter; and
   when the control signal indicates that the mode signal does not select the encoding mode, forwarding the third audio signal as the output signal of the analog-to-digital converter.

10. The analog-to-digital conversion method as claimed in claim 9, wherein the analog-to-digital conversion method further comprises:
    receiving a clock signal oscillating between a logic low level and a logic high level;
    outputting data bits of the output signal when the clock signal is at the logic low level if the channel selection signal is at the logic low level; and
    outputting data bits of the output signal when the clock signal is at the logic high level if the channel selection signal is at the logic high level.

11. The analog-to-digital conversion method as claimed in claim 9, wherein encoding of the fourth audio signal further comprises:
    when the channel selection signal is at a logic low level, adding a positive offset value to the third audio signal with the signal coding module to obtain the fourth audio signal, and
    when the channel selection signal is at a logic low level, adding a negative offset value to the third audio signal with the signal coding module to obtain the fourth audio signal.

12. The analog-to-digital conversion method as claimed in claim 9, wherein encoding of the fourth audio signal further comprises:
    when the channel selection signal is at a logic low level, multiplying the third audio signal by a first multiplier with the signal coding module to obtain the fourth audio signal; and
    when the channel selection signal is at a logic low level, multiplying the third audio signal by a second multiplier with the signal coding module to obtain the fourth audio signal,
    wherein the first multiplier is greater than 1 and the second multiplier is smaller than 1.

13. The analog-to-digital conversion method as claimed in claim 9, wherein encoding of the fourth audio signal further comprises:
    when the channel selection signal is at a logic low level, forwarding the third audio signal as the fourth audio signal with the signal coding module; and
    when the channel selection signal is at a logic low level, inverting the phase of the third audio signal with the signal coding module to obtain the fourth audio signal.

14. The analog-to-digital conversion method as claimed in claim 9, wherein encoding of the fourth audio signal further comprises:
    when the channel selection signal is at a logic low level, delaying the third audio signal with the signal coding module to obtain the fourth audio signal; and
    when the channel selection signal is at a logic low level, forwarding the third audio signal with the signal coding module as the fourth audio signal.

* * * * *